United States Patent [19]

Graham

[11] 4,288,865
[45] Sep. 8, 1981

[54] LOW-POWER BATTERY BACKUP CIRCUIT FOR SEMICONDUCTOR MEMORY

[75] Inventor: Andrew C. Graham, Dallas, Tex.

[73] Assignee: Mostek Corporation, Carrollton, Tex.

[21] Appl. No.: 119,293

[22] Filed: Feb. 6, 1980

[51] Int. Cl.³ ............................................. G11C 7/00
[52] U.S. Cl. ..................................... 365/229; 307/64
[58] Field of Search ............... 365/226, 228, 229, 195; 307/64

[56] References Cited

U.S. PATENT DOCUMENTS

| | | | |
|---|---|---|---|
| 3,859,638 | 1/1975 | Hume | 365/229 |
| 4,122,359 | 10/1978 | Breikss | 365/229 |
| 4,148,099 | 4/1979 | Lauffer et al. | 365/229 |

FOREIGN PATENT DOCUMENTS 52-11722  1/1977  Japan ................................. 365/229

*Primary Examiner*—Stuart N. Hecker

[57] ABSTRACT

A battery backup circuit for an MOS memory which has a multiplexed pin ($\overline{WE}$) that functions to provide backup power to a memory cell array (50) upon loss of primary power $V_{cc}$. A voltage comparator (10) detects when the primary power $V_{cc}$ becomes less than the backup voltage on the $\overline{WE}$ terminal. Upon detection of loss of primary power the memory cell array (50) is powered by a connection to the $\overline{WE}$ terminal. A primary power status signal ($\overline{POK}$) indicates the status of the primary power and is driven to a state indicating insufficient circuit voltage for normal operation when $V_{cc}$ drops below an acceptable limit or when there is inadequate substrate bias. The circuit of the present invention further generates an inhibit signal to prevent the operation of peripheral circuits (70) to write data into the memory cell array (50) upon detection of a failure of primary power. The inhibit signal is generated when primary power is lost or when the substrate bias is inadequate. A low-power auxiliary pump generator (92) provides a sufficient substrate bias to maintain the data pattern in the memory cell array (50) during the backup mode.

12 Claims, 2 Drawing Figures

LOW-POWER BATTERY BACKUP CIRCUIT FOR SEMICONDUCTOR MEMORY

TECHNICAL FIELD

This invention relates generally to integrated semiconductor memory circuits utilizing field effect transistors and more particularly pertains to a circuit for automatically switching to a backup power source upon loss of the main power source to thereby maintain the bit pattern stored in the memory array.

BACKGROUND ART

Heretofore bulk memories for computer systems have frequently utilized magnetic core technology wherein a large number of magnetic rings are employed with each ring serving as a memory storage element. The data state of the ring is dependent upon the direction of magnetization of the ring. A primary advantage of this type memory is that the information stored in the memory is not lost when power is removed. The rings remain magnetized in the selected states even when power is not supplied to the memory unit. A magnetic core memory can be reactivated and returned to use immediately upon reapplication of electrical power. There is no need to reload the programs and data into memory each time the power is disconnected.

In large computer systems, programs and data are frequently stored on disk memories so that the system can be initialized from disk, even after a power failure. But in smaller computer applications, programs and data are often entered manually and are not stored in any readily accessible manner. Therefore, a power loss which causes loss of the stored bit pattern in memory is a serious failure of the system which cannot be remedied by merely restoring main power.

There have recently come into widespread use semiconductor random access memories which have decided advantages over the older core type memories. In particular, the newer memories are faster, have lower power consumption and occupy less space. However, a serious drawback in the use of semiconductor memories is that each of the memory element circuits is volatile, that is, the information stored in the memory element is lost when power is removed from the memory circuit. With such a memory system the programs and data stored in the memory are lost whenever power is removed from the memory unit. Although the loss of power does not result in circuit damage, the loss of stored information does require that the system be reloaded with programs and data before processing can continue. The reloading of programs is a time consuming process which reduces the efficient utilization of a computer system. In certain types of systems a provision is made to transfer the contents of memory to disk when a failure is first indicated. But in many computer systems a power failure occurs so rapidly that all of the memory contents cannot be transferred to disk. This is particularly true for process control systems.

It has been proposed to solve the data loss problem by using an additional pin terminal on memory type semiconductor circuits and that this terminal be supplied with a backup power supply to maintain the data in the memory cells. But the mere addition of another pin does not fully solve the problem. The backup power supply generally comprises a battery system and as such cannot supply the heavy current requirements of semiconductor memories for any period of time. Further, there are now established standardized pin patterns for most integrated circuit memories and the addition of another pin dedicated to the backup power supply would constitute an inconsistency in the standards and would require substantial redesign in existing circuits.

Therefore, there exists a need for a backup power circuit for semiconductor memories wherein the standard pin configuration is not effected, the data pattern is retained despite a loss of the main power supply, and the circuit is internally powered down so that the power consumption used to retain memory is sufficiently small to be supplied by a backup battery of reasonable size, yet for a long period of time.

DISCLOSURE OF THE INVENTION

The present invention comprises a circuit for maintaining a bit pattern which is stored in a memory array of a semiconductor memory circuit during a low power mode. The usual memory circuit includes peripheral circuits for accessing and controlling the memory, the memory array, a primary power terminal and a control terminal. The control terminal is connected to receive secondary power upon failure of a primary power source which is connected to drive the circuit through the primary power terminal. The memory array, which includes the memory cells, has a dedicated power node.

The circuit of the present invention includes a voltage comparator for comparing the voltages received by the semiconductor memory circuit at the primary power terminal and the control terminal to produce a first state at an output node of the voltage comparator when the voltage at the primary power terminal exceeds the voltage at the control terminal. The voltage comparator produces a second state at the output node thereof when the voltage at the control terminal exceeds the voltage at the primary power terminal. Circuit means are provided for coupling the primary power terminal to the memory array power node through a low impedance path when the voltage comparator output node is at the first state. The primary power terminal is coupled through a high impedance path to the memory array power node when the comparator output node is at the second state.

Further circuit means are provided for coupling the control terminal to the memory array power node through a high impedance part when the voltage comparator output node is at the first stage and through a low impedance path when the voltage comparator output node is at the second state.

A substrate bias generator is provided for biasing the substrate of the semiconductor memory circuit to a negative potential. The substrate bias voltage is monitored by a circuit which produces a first state at a monitor node when the substrate bias voltage is greater than a preset magnitude and produces a second state at the monitor node when the substrate bias voltage is less than the preset magnitude.

Circuit means are provided for inhibiting the peripheral circuits when the output node of the voltage comparator is at the second state or when the monitor node is at the second state to prevent the peripheral circuits from accessing the memory cells and changing any bits stored therein after the main power has been lost.

BRIEF DESCRIPTION OF THE DRAWINGS

For a more complete understanding of the present invention and the advantages thereof, reference is now made to the following Description taken in conjunction with the accompanying Drawings in which.

DETAILED DESCRIPTION

Most computer systems have power supplies which not only provide transformation and rectification of the line alternating current but include circuitry for monitoring the line current to detect a failure. The filters within such power supplies have sufficient energy storage so that a line failure can be detected and a warning supplied to the computer so that the computer has sufficient time to take actions to prevent the loss of data and to prevent damage to peripheral systems, such as disk drives. After an AC line signal is lost, the power supply can continue to provide power for a period of a few milliseconds. Upon receiving a warning that the line current has failed the computer can switch in a backup power source so that the data stored in memory can be preserved.

In the present invention a backup power supply is connected to a multiplexed terminal for each memory circuit so that the memory array within the circuit can continue to be powered to maintain the data stored therein until full power is recovered. The circuit of the present invention provides for a transition of powering the memory array from the normal power terminal to a selected pin upon loss of primary power. The selected pin is normally used to receive a control signal for the memory circuit. The circuit further prohibits any reading or writing in the memory array while in the backup mode. The circuit further provides for a smooth transition from the backup mode to normal operation when primary power is restored. The secondary power is provided only to the memory array and not to the peripheral supporting circuits which cannot be used in the backup mode in any case. If high impedance loads are used in the memory cells of the array, extremely low power consumption can be achieved in the backup mode.

Figure 1:
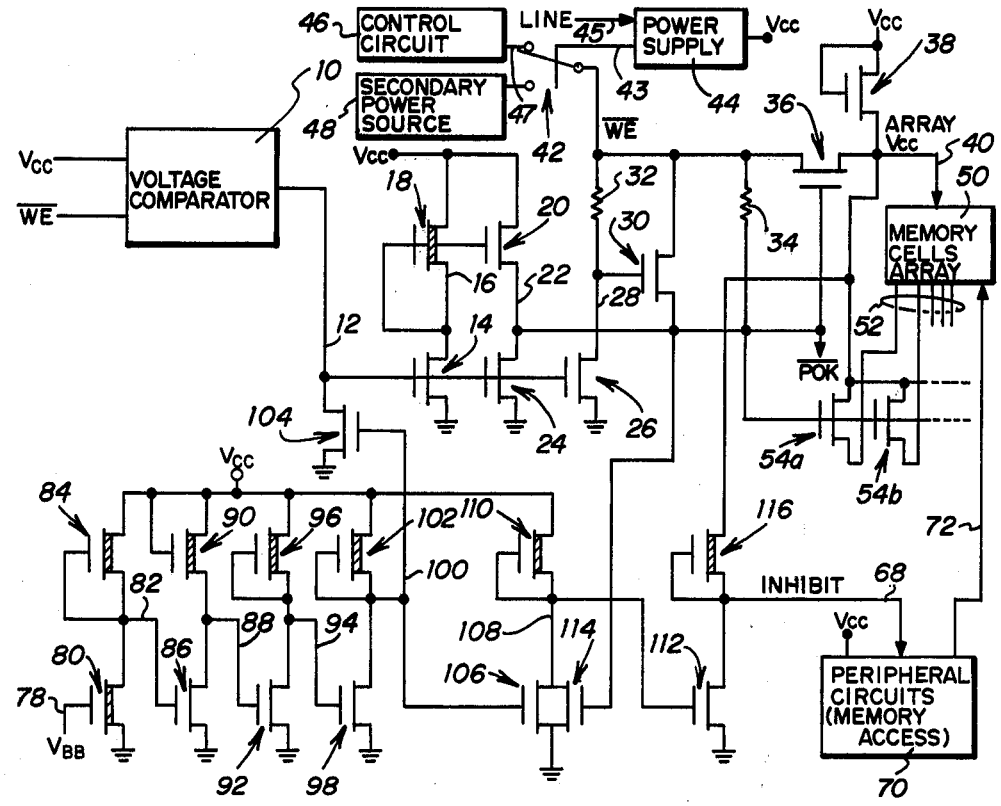
FIG. 1 is a schematic circuit diagram of a backup memory circuit in accordance with the present invention.

Referring now to FIG. 1 there is shown a schematic diagram of the backup power circuit of the present invention. The primary power, $V_{cc}$, is supplied to the circuit through a selected external pin to a primary power terminal for the memory circuit. The backup power is supplied to the circuit by multiplexing a particular pin which in this embodiment is the write enable pin. During routine operation of the memory circuit a write enable ($\overline{WE}$) signal controls whether the circuit is operating in a read or write mode. But, upon loss of primary power, external circuitry disconnects the write enable signal and substitutes on the $\overline{WE}$ pin a backup or secondary power source, generally a battery.

A voltage comparator 10 is connected to the primary power terminal receiving $V_{cc}$ and to the $\overline{WE}$ terminal which receives the $\overline{WE}$ signal. Voltage comparator 10 produces a high level at node 12, the voltage comparator output, when $V_{cc}$ is greater than the voltage on the $\overline{WE}$ terminal. Node 12 is set to a low level when $V_{cc}$ is less than the voltage on the $\overline{WE}$ terminal. The voltage comparator 10 can further be operated so that a high voltage is produced on node 12 when the voltage on the $\overline{WE}$ terminal is not greater than the power voltage $V_{cc}$ by a preselected voltage offset, and a low voltage is produced at node 12 when the voltage on the $\overline{WE}$ terminal is greater than the power voltage $V_{cc}$ by the preselected voltage offset. Thus, if $\overline{WE}$ is held at a high level, the output node 12 of voltage comparator 10 transitions from a high level to a low level when $V_{cc}$ falls from its normal operating range.

Node 12 is connected to the gate terminal of a transistor 14 which is turned on when the voltage on node 12 is high but is rendered nonconductive when the voltage on node 12 is low. Transistor 14 is therefore turned off when $V_{cc}$ becomes less than the voltage on the $\overline{WE}$ terminal less the preselected offset. The drain terminal of transistor 14 is connected to a node 16 which has a high level when transistor 14 is nonconductive. But when transistor 14 is made conductive, node 16 is pulled to a low potential.

Node 16 is connected to both the gate and source terminals of a depletion mode field effect transistor 18. The drain terminal of transistor 18 is connected to $V_{cc}$. Transistor 18 serves as a resistive load to limit current flow through transistor 14.

Node 16 is further connected to the gate terminal of transistor 20 which has the drain terminal thereof connected to $V_{cc}$. When node 16 transitions from a low level to a high level, transistor 20 is turned on thus elevating a node 22 to a high level which is $V_{cc}$ minus the threshold voltage, $V_t$, of transistor 20. Node 22 is connected to both the source terminal of transistor 20 and the drain terminal of a transistor 24. The source terminal of transistor 24 is connected to a common ground. Node 22 serves as a power status node and is connected to an output terminal designated $\overline{POK}$. The signal represented by $\overline{POK}$ is a status signal which indicates that the primary power for the circuit is within the proper operating range. This signal is an active low which means that the acceptable status is indicated by a low level while an unacceptable status is indicated by a high level. The signal level on node 22 is influenced by connections at a plurality of points within the circuit.

Node 12, the output of voltage comparator 10, is further connected to the gate terminal of a transistor 26 which is turned on when node 12 is at a high level. The drain of transistor 26 is connected to a node 28 which is further connected to the gate terminal of a transistor 30. A resistor 32 is connected between the $\overline{WE}$ terminal and the gate of transistor 30. The drain terminal of transistor is also connected to the $\overline{WE}$ terminal while the source terminal of transistor 30 is connected to node 22.

A resistor 34 is connected between the $\overline{WE}$ terminal and node 22. A transistor 36 has the gate terminal thereof connected to node 22 while the drain terminal is connected to the $\overline{WE}$ terminal and the source terminal is connected to a memory array $V_{cc}$ node 40. The array $V_{cc}$ is the supply voltage for the memory cells within the memory circuit.

As noted above, the primary power for the entire circuit is provided by $V_{cc}$. This primary power source is further connected to the gate and drain terminals of a transistor 38 which has the source terminal thereof connected to supply the array $V_{cc}$ which is designated as node 40.

The $\overline{WE}$ terminal is connected to a switch 42 which is controlled by an output line 43 from a power supply 44. A line supply 45, generally 120 volts at 60 Hz, is input to the power supply 44 to produce the voltage $V_{cc}$ for powering the memory circuit. The switch 42 connects the $\overline{WE}$ terminal to either a control circuit 46 which generates the write enable signal or to a secondary power source 48, such as a battery. The write enable signal is transmitted from control circuit 46 through a control line 47 which is connected to one input terminal of switch 42.

The power supply 44 includes circuitry to monitor the incoming line voltage and determine when such voltage has failed. A power supply which provides this function is a model H7100 manufactured by Digital Equipment Corporation. Upon noting such a failure, the power supply 44 through line 43 causes the switch 42 to move from the normal connection with the control circuit 46 to connection with the secondary power source 48. The filter capacitors within the power supply 44 are of sufficient size to enable the power supply to provide sufficient power for its own operation and sufficient current to maintain $V_{cc}$ for a period of a few milliseconds. Thus, the switch 42 serves to multiplex the operation of the $\overline{WE}$ terminal so that in the event of a failure of primary power the $\overline{WE}$ terminal is connected to receive backup power to supply the memory circuit. In the preferred embodiment the secondary power source 48 is a battery or a battery driven power source. Switch 42 is preferably a logical or solid state switch rather than a mechanical switch.

The array $V_{cc}$, node 40, is connected to power memory cells 50 for normal operations and for data protection in the backup mode. The circuitry for the memory cells 50 is described and illustrated in U.S. Pat. No. 3,967,252 to Donnelly. The memory cells 50 include a plurality of bit lines 52, each of which is connected to a plurality of the individual memory cells within circuit 50. Each of the bit lines is connected to the source terminal of a corresponding transistor 54a, 54b, . . . . The drain terminals of the transistors 54 are connected in common to the array $V_{cc}$ at node 40. The gate terminals of the transistors 54 are connected in common to the node 22 which indicates the status of the power supplied to the memory circuit.

Referring to the lower portion of FIG. 1, the primary voltage supply $V_{cc}$ is supplied to a plurality of transistors which are utilized to generate an inhibit signal on node 68 which when activated prohibits the writing of data into the memory cell array after the line supply has been lost and the memory is operating in the backup mode. Node 68 is connected to supply the inhibit signal to peripheral circuits 70 which control and access the memory cell array 50 through a communication path 72. When circuits 70 are inhibited, no action can be taken to read or write data in the memory cell array 50, thus preserving the bit pattern stored therein.

A substrate bias voltage $V_{BB}$ is transmitted through a node 78 to the gate terminal of a depletion mode transistor 80. The source terminal of transistor 80 is grounded and the drain terminal thereof is connected to a node 82 which serves as a substrate bias monitor mode.

A depletion mode transistor 84 is connected at its drain terminal to $V_{cc}$ while its gate and source terminals are connected to node 82. Transistor 84 serves essentially as a load impedance for transistor 80. Node 82 is further connected to the gate terminal of a transistor 86 which has its source terminal grounded. The drain terminal of transistor 86 is connected to a node 88 that is also connected to the source terminal of a depletion mode transistor 90. Both the gate terminal and the drain terminal of transistor 90 are connected to $V_{cc}$ so that transistor 90 operates as a load impedance for transistor 86.

Node 88 is further connected to the gate terminal of a transistor 92 which has its source terminal grounded. The drain terminal of transistor 92 is connected to a node 94 which is in turn connected to the gate and source terminals of a depletion mode transistor 96. The drain terminal of transistor 96 is likewise connected to $V_{cc}$. Transistor 96 serves as a load impedance for transistor 92.

Node 94 is further joined to the gate terminal of a transistor 98 which has its source terminal grounded. The drain terminal of transistor 98 is connected to a node 100. Both the gate and source terminals of a depletion mode transistor 102 are connected to node 100 while the drain terminal of transistor 102 is likewise connected to $V_{cc}$. Transistor 102 operates as a load impedance for transistor 98.

Node 100 extends to the gate terminal of a transistor 104 which has its drain terminal joined to node 12. The source terminal of transistor 104 is grounded. When node 100 goes high, transistor 104 is turned on which pulls node 12 low.

Node 100 is further connected to the gate terminal of a transistor 106 which has the source terminal thereof grounded. The drain terminal of transistor 106 is connected to a node 108 that is joined to the gate and source terminals of a depletion mode transistor 110. The drain terminal of transistor 110 is connected to $V_{cc}$. Node 108 is further connected to the gate terminal of a transistor 112 which has its source terminal grounded. The drain terminal of transistor 112 is connected to node 68. Node 108 is further connected to the drain terminal of a transistor 114, the gate terminal of which is connected to node 22 and the source terminal of which is grounded.

Node 68, which transmits the inhibit signal to circuits 70, is further joined to the gate and source terminals of a transistor 116 which has the drain terminal thereof connected to node 40. Transistor 116 limits the current flow through transistor 112.

Referring to FIG. 1 for an operational description of the backup memory circuit of the present invention, the purpose of the circuit is to supply sufficient backup power to the memory cells 50 of the memory circuit so that the data pattern present in the cells is retained despite loss of primary power. The circuit must further inhibit the peripheral circuits 70 to prohibit the writing of possibly erroneous data into the memory cells 50 after a failure of the primary power supply. The circuit further supplies a signal indicating the status of the main power supply, this being the $\overline{POK}$ signal on node 22.

Under normal operations $\overline{POK}$ is low so that transistor 36 is turned off. $V_{cc}$ is normally at a five volt level plus or minus 10%. Transistor 38 functions as a diode and is turned on so that the array $V_{cc}$, node 40, is at a voltage of $V_{cc}$ minus one threshold voltage $V_t$.

When the primary supply providing $V_{cc}$ fails, the voltage on node 22 is pulled upward in a series of steps. When the voltage comparator 10 detects that the voltage on the $\overline{WE}$ terminal exceeds $V_{cc}$, or optionally exceeds $V_{cc}$ by more than a preselected voltage offset, node 12 is driven low which causes transistors 14, 24 and 26 to be turned off. As $V_{cc}$ falls from five volts, node 16 is pulled up rapidly to the $V_{cc}$ potential, which would be around four volts. Since node 16 is connected to the gate terminal of transistor 20, the voltage on node 16 causes transistor 20 to be turned on thereby elevating node 22 to a voltage which is one threshold $V_t$ below $V_{cc}$. In this embodiment $V_t$ is generally 1 volt. Thus, when $V_{cc}$ begins to drop, node 22 is rapidly pulled up to approximately a three volt level. But, as $V_{cc}$ continues to fall, transistor 20 will not pull the voltage on node 22 to zero. When $V_{cc}$ drops to the range of 1–2 volts, there will be insufficient bias on the gate terminal of transistor 20 to hold it turned on. Transistor 20 will then turn off and isolate node 22 from the $V_{cc}$ terminal.

When the output node 12 of comparator 10 changes from high to low, node 12 will be snapped up to $V_{cc}$-$V_t$. This voltage on node 22 is sufficient to turn on transistor 114 which in turn causes transistor 112 to be turned off thereby applying the inhibit signal to circuits 70 to protect the data in memory cells 50.

The next step in charging node 22 is provided by transistor 30 which has its gate terminal quickly charged up to the potential on the $\overline{WE}$ terminal when transistor 26 is turned off. This pulls node 22 up to the voltage on the $\overline{WE}$ terminal minus one threshold voltage $V_t$, that being of transistor 30. The final step in charging node 22 is provided by resistor 34. This resistor charges node 22 upward to the full potential on the $\overline{WE}$ terminal. Thus, node 22 which corresponds to the $\overline{POK}$ signal is raised from low to high when $V_{cc}$ becomes less than the voltage on the $\overline{WE}$ terminal or by a specific voltage offset.

When $V_{cc}$ falls from high to low, transistor 38 will be turned off while the transition of node 22 from low to high causes transistor 36 to be turned on thereby connecting the $\overline{WE}$ terminal to the memory array $V_{cc}$ node 40. Thus, in the backup mode the array $V_{cc}$ is equal to the voltage on the $\overline{WE}$ terminal minus one threshold drop which occurs across transistor 36.

In the normal power mode the $\overline{WE}$ terminal is connected to a very high impedance circuit which draws little current and allows the control signal on this terminal to function in its normal manner in supplying a write signal to the memory circuit. But in the backup mode the write signal will not be used, and the $\overline{WE}$ terminal is connected to supply the backup power to the memory cells through the array $V_{cc}$ node 40.

The inhibit signal at node 68 is generated to disable the peripheral circuits 70 to prevent any data from being written into the memory cells. When node 22 rises from low to a level of several volts, transistor 114 is turned on thereby pulling down node 108. A low potential on node 108 causes transistor 112 to be turned off thereby elevating node 68 to the potential of the array $V_{cc}$, node 40.

Note that when $V_{cc}$ is lost the peripheral circuits do not draw any current from the secondary power source 48 since they are powered solely by $V_{cc}$.

Each memory cell within the memory cells 50 is connected to one of the bit lines 52. The bit lines are utilized to transfer data state information into and out of the individual cells. The transistors 54 are connected so that each bit line is supplied with the array $V_{cc}$ minus one threshold $V_t$. It is important that this voltage be maintained on the bit lines since over a period of time the internal cell nodes can discharge as a result of subthreshold leakage through the respective access transistors. Further the bit lines 56 must be maintained at a relatively high potential so that upon reestablishment of the primary power there will be current surge through $V_{cc}$. This aspect is described in further detail in copending application Ser. No. 119,538 by W. D. Parkinson filed Feb. 7, 1980 and assigned to the assignee in the present case.

Figure 2:
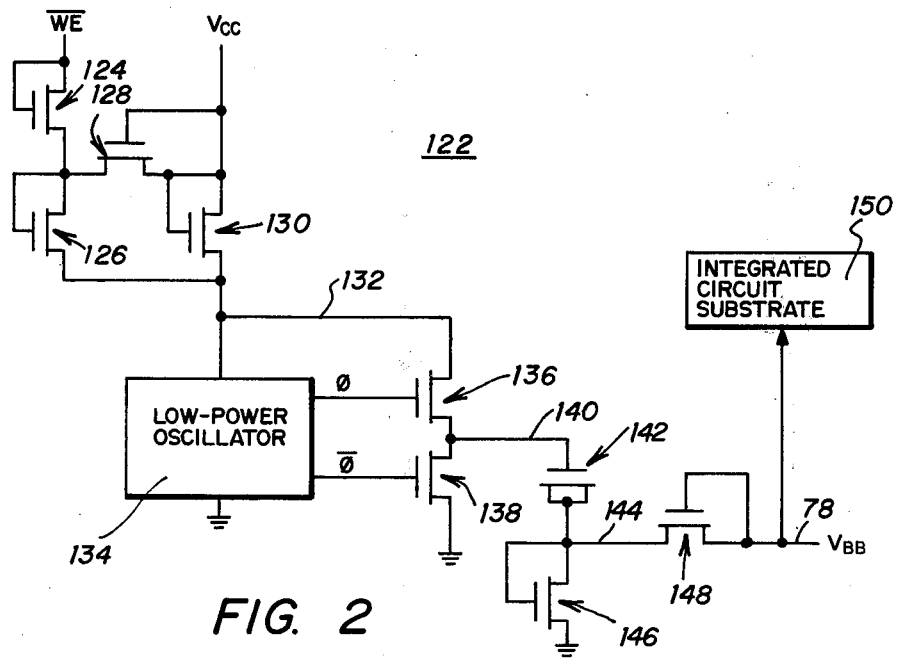
FIG. 2 is a schematic circuit diagram of an auxiliary pump generator provided with a power source selection circuit.

Referring now to FIG. 2 a further feature of the present invention involves a substrate bias voltage $V_{BB}$.

In MOS (metal oxide semiconductor) circuits it is desirable to maintain the substrate with a negative bias voltage. Under normal operations a primary substrate pump provides a regulated −4 volts to the substrate for optimum performance of the circuit. This pump is disabled when $V_{cc}$ is lost.

The substrate bias voltage is also important in regard to the transistion from the backup mode to primary power. The primary power terminal is capacitively coupled to the substrate and will tend to pull the substrate positive when $V_{cc}$ is reestablished. If the substrate is drawn from a negative voltage to zero volts or positively biased, there is a substantial likelihood that data will be lost. Therefore the bias voltage $V_{BB}$ must be sufficiently negative to prevent the substrate from being pulled to a positive potential through capacitive coupling to the primary power terminal.

The circuit of FIG. 2 is an auxiliary substrate pump which provides sufficient negative bias for the substrate to maintain the data pattern in the memory cells. The auxiliary substrate pump 122 is connected to both the $V_{cc}$ primary power source and the $\overline{WE}$ terminal for backup power. $V_{cc}$ and the $\overline{WE}$ terminal are connected to power the substrate pump circuit 122 through a gating arrangement of transistors 124, 126, 128 and 130. Each of these four transistors has the gate terminal connected to its drain terminal so that the transistor functions essentially as a diode. When $V_{cc}$ exceeds the voltage on the $\overline{WE}$ terminal less $V_T$ transistors 128 and 130 will be turned on thereby connecting $V_{cc}$ to a node 132 with a one threshold voltage drop. Under these conditions transistors 124 and 126 are turned off thereby isolating the $\overline{WE}$ terminal through a high impedance from $V_{cc}$ and the circuit 122.

When the voltage on the $\overline{WE}$ terminal exceeds $V_{cc}$ plus one $V_t$, transistors 124 and 126 are turned on while transistors 128 and 130 are turned off. This arrangement connects the $\overline{WE}$ terminal to node 132 while isolating $V_{cc}$ from the $\overline{WE}$ terminal and node 132. Thus, node 132 is connected to the higher of either $V_{cc}$ or the voltage on the $\overline{WE}$ terminal.

Node 132 is connected to supply power to a low power oscillator 134 and to a transistor 136. Oscillator 134 generates an in-phase signal designated as $\phi$ and the inverse of $\phi$ which is designated as $\bar{\phi}$. The signal $\phi$ is input to the gate of transistor 136 while the $\bar{\phi}$ signal is input to the gate of a transistor 138. The source terminal of transistor 136 is connected to a node 140 which is in turn connected to the drain terminal of transistor 138. The source terminal of transistor 138 is grounded. The out-of-phase signals input to transistors 136 and 138 produce a square wave signal at node 140. The signal on node 140 is transmitted to the gate terminal of a transistor 142 which is connected to function as a capacitor. The source and drain terminals of transistor 142 are interconnected at a node 144. A transistor 146 has its drain and gate terminals connected to node 144 while the source terminal thereof is grounded so that transistor 146 functions as a diode biased toward ground. Node 144 is further connected to the source terminal of a transistor 148 which also has its gate and drain terminals interconnected so that transistor 148 functions as a diode biased toward node 144.

Still referring to FIG. 2, oscillator 134 produces signals which are out of phase and thereby produce a square wave signal at node 140. The square wave is transmitted from node 140 to node 144 through transistor 142 which functions as a capacitor and blocks DC.

When node 144 goes high transistor 146 is turned on so that node 144 is subsequently discharged through transistor 146. When node 144 goes negative transistor 146 is turned off and node 144 is pulled to a negative voltage. A positive voltage on node 144 is blocked by transistor 148 while a negative voltage at node 144 is transmitted through transistor 148 to node 78 (also shown in FIG. 1). Node 78 supplies the substrate bias $V_{BB}$ to the integrated circuit substrate 150 which is integral with the circuits shown in FIGS. 1 and 2.

Referring back to FIG. 1 the circuit shown therein also monitors the substrate bias voltage $V_{BB}$ so that the $\overline{POK}$ signal is driven to a high level when there is insufficient substrate bias. When $V_{BB}$ is sufficiently negative, approximately $-2$ to $-3$ volts, depletion mode transistor 80 is turned off. This action raises node 82 high which turns transistor 86 on thereby lowering node 88. The low voltage on node 88 turns transistor 92 off thereby raising node 94 to a high level. The high level on node 94 turns transistor 98 on thereby pulling node 100 to a low level and turning transistor 104 off. When transistor 104 is turned off node 12 is pulled to go to a high level to indicate that $V_{cc}$ exceeds the voltage on the $\overline{WE}$ terminal. When node 12 is high node 22 is low thereby indicating by signal $\overline{POK}$ that the primary voltage $V_{cc}$ and the bias voltage $V_{BB}$ are satisfactory.

If $V_{BB}$ should not be sufficiently negative and therefore be approximately 0 volts, transistor 80 is on, thereby pulling node 82 low. This action turns transistor 86 off thereby elevating node 88 to a high level. A high level on node 88 turns transistor 92 on thereby pulling node 94 to a low level. The low level on node 94 turns transistor 98 off thereby raising node 100 to a high level and turning transistor 104 on which pulls node 12 to a low level thereby initiating the same sequence of events which occurs when $V_{cc}$ is less than the voltage on the $\overline{WE}$ terminal. The result of an insufficiently negative $V_{BB}$ causes the generation of a high level $\overline{POK}$ signal indicating loss of power and the generation of an inhibit signal which prevents any peripheral circuits from writing data into the memory cells. It also keeps the peripheral circuit disabled to reduce power consumption and prevent bus contention problems.

In summary, the circuit of the present invention provides a means for supplying a backup voltage to memory cells through multiplexing an external pin so that upon failure of primary power the data pattern stored in the memory cells is retained and protected from erroneous write operations. The memory circuit operates in a low power mode when the memory array is powered by the backup power source. The circuit protects the stored data by monitoring the substrate bias voltage generated by an onboard substrate pump generator. During the backup mode only the memory cells and portions of the control circuit are powered while the peripheral circuits are not supplied with power. In the backup mode the memory cells draw very little current thereby enabling a large memory, on the order of megabytes, to maintain a stored data pattern despite loss of primary power, while using very small batteries.

Although only one embodiment of the invention has been illustrated in the accompanying Drawings and described in the foregoing Detailed Description, it will be understood that the invention is not limited to the embodiment disclosed, but is capable of numerous rearrangements, modifications and substitutions without departing from the scope of the invention.

I claim:

1. A circuit for maintaining a bit pattern which is stored in a memory array of an integrated semiconductor memory circuit during a low power mode, said memory circuit including peripheral memory access circuits for reading and writing data into and from said memory array, a primary power terminal, and a control terminal which receives secondary power upon failure of a primary power source connected to power said memory circuit through said primary power terminal, said memory array having a dedicated power node, comprising in combination:

means for comparing the voltages received by said memory circuit at said primary power terminal and at said control terminal to produce a first state at an output node of said means for comparing when the voltage at said control terminal does not exceed the voltage at said primary power terminal by more than a preselected offset voltage and to produce a second state at said output node when the voltage at said control terminal exceeds the voltage at said primary power terminal by more than said preselected offset voltage, means for coupling said primary power terminal to said memory array power node through a low impedance path when said voltage comparator output node is at said first state and through a high impedance path when said voltage comparator output node is at said second state, means for coupling said control terminal to said memory array power node through a high impedance path when said voltage comparator output node is at said first state and through a low impedance path when said voltage comparator output node is at said second state, means for generating a substrate bias voltage for said integrated memory circuit, means for monitoring said substrate bias voltage to produce a first state at a monitor node when said substrate bias voltage is greater than a preset magnitude and to produce a second state when said substrate bias voltage is less than said preset magnitude, and means for inhibiting said peripheral circuits when said output node of said voltage comparator is at said second state or said monitor node is at said second state to prevent said peripheral circuits from accessing said memory array.

2. The circuit recited in claim 1 wherein said means for coupling said primary power terminal to said memory array power mode comprises an enhancement field effect transistor having gate, source and drain terminals, said gate and drain terminals connected to each other and to said primary power terminal and said source terminal connected to said memory array power node.

3. The circuit recited in claim 1 wherein said means for coupling said control terminal to said memory array power node comprises a plurality of field effect transistors each having gate, source and drain terminals including a first transistor having the drain terminal thereof connected to said control terminal, the source terminal thereof connected to said memory array power node and the gate terminal thereof connected to the drain terminal of a second transistor having the source terminal thereof connected to a common node and the gate terminal thereof connected to said voltage comparator output node, a third transistor having the drain terminal thereof coupled to said primary power terminal, the source terminal thereof connected to said common node and the gate terminal thereof connected to said voltage comparator output node, and a fourth transistor having the drain terminal thereof connected to said primary power terminal, the source terminal thereof connected to the gate terminal of said first transistor and the gate terminal thereof connected to the drain terminal of said third transistor.

4. The circuit recited in claim 3 wherein each bit line in said memory array is connected to the source terminal of a corresponding transistor, said transistor having the drain terminal thereof connected to said memory array power node and the gate terminals thereof connected to the drain terminal of said second transistor.

5. The circuit recited in claim 1 further including routing circuit means for powering said means for generating a substrate bias voltage with the greater of the voltages at said primary power terminal or said control terminal.

6. The circuit recited in claim 1 wherein said preselected offset voltage is set to essentially zero volts whereby said output node is driven to a first state when the voltage at said primary power terminal exceeds the voltage at said control terminal and said output node is driven to a second state when the voltage at said control terminal exceeds the voltage at said primary power terminal.

7. A circuit for maintaining a bit pattern in a memory array of a powered down semiconductor integrated memory circuit wherein the memory array is controlled and accessed by peripheral circuits, said memory circuit including a primary power terminal connected for powering terminal which receives backup power when there is a loss of a primary power supply connected to said primary power terminal, comprising:
- a voltage comparator connected to said primary power terminal and said control terminal for driving a comparator output node to a first state when the voltage at said control terminal does not exceed the voltage at said primary power terminal by more than a preselected offset voltage and to a second state when the voltage at said control terminal exceeds the voltage at said primary power terminal by more than said preselected offset voltage,
- means connected to said comparator output node for driving a power status node to a first state when said comparator node is at said second state and for driving said power status node to a second state when said comparator output node is at said first state,
- means for coupling said primary power terminal to a power node for said memory array through a low impedance path when said power status node is at said second state and through a high impedance path when said power status node is at said first state,
- means for coupling said control terminal to said memory array power node through a low impedance path when said power status node is at said first state and through a high impedance path when said power status node is at said second state,
- means for generating a substrate bias voltage which is applied to bias the substrate of said integrated semiconductor memory circuit,
- means connected to receive said bias voltage for driving a monitor node to a first state when said bias voltage exceeds a preset voltage and driving said monitor node to a second state when said bias voltage does not exceed said preset voltage,
- means connected between said monitor node and said power status node for driving said power status node to the second state thereof, and
- means connected to said power status node for generating an inhibit signal which is transferred to said peripheral circuits to inhibit the operation thereof when said power status node is at the first state thereof.

8. The circuit recited in claim 7 wherein said preselected offset voltage is set to essentially zero volts whereby said output node is driven to a first state when the voltage at said primary power terminal exceeds the voltage at said control terminal and said output node is driven to a second state when the voltage at said control terminal exceeds the voltage at said primary power terminal.

9. A circuit for maintaining a bit pattern in a memory array of a powered down semiconductor integrated memory circuit wherein the memory array is controlled and accessed by peripheral circuits, said memory circuit including a primary power terminal connected for powering said peripheral circuits and a memory circuit control terminal which receives backup power when there is a loss of a primary power supply connected to said primary power terminal, comprising:
- a voltage comparator connected to said primary power terminal and said control terminal for driving a comparator ouput node to a first state when the voltage at said control terminal does not exceed the voltage at said primary power terminal by more than a preselected offset voltage and to a second state when the voltage at said control terminal exceeds the voltage at said primary power terminal by more than said preselected offset voltage,
- means connected to said comparator output node, said primary power terminal and a power status node for pulling said power status node to within one transistor threshold voltage of the voltage at said primary power terminal when said comparator output node transitions from the first state thereof to the second state thereof,
- means connected to said comparator output node, said control terminal and said power status node for pulling said power status node to within one transistor threshold voltage of the voltage at said control terminal following the transition of said comparator output node from said first state to said second state,
- a resistor connected between said control terminal and said power status node to pull the voltage on said power status node up to the voltage at said control terminal when said comparator output node is at the second state thereof,
- means for coupling said primary power terminal to a power node for said memory array through a low impedance path when said power status node is at said second state and through a high impedance path when said power status node is at said first state,
- means for coupling said control terminal to said memory array power node through a low impedance path when said power status node is at said first state and through a high impedance path when said power status node is at said second state,
- means for generating a substrate bias voltage which is applied to bias the substrate of said integrated semiconductor memory circuit, means connected to receive said bias voltage for driving a monitor node to a first state when said bias voltage exceeds a preset voltage and driving said monitor node to a second state when said bias voltage does not exceed said preset voltage, means connected between said monitor node and said power status node for driving said power status node to the second state thereof when said monitor node is at the second state thereof, and means connected to said power status node for generating an inhibit signal which is transferred to said peripheral circuits to inhibit the operation thereof when said power status node is at the first state thereof.

10. The circuit recited in claim 9 wherein said preselected offset voltage is set to essentially zero volts whereby said output node is driven to a first state when the voltage at said primary power terminal exceeds the voltage at said control terminal and said output node is driven to a second state when the voltage at said control terminal exceeds the voltage at said primary power terminal.

11. A circuit for maintaining a bit pattern in a memory array of a powered down semiconductor integrated memory circuit wherein the memory array is controlled and accessed by peripheral circuits, said memory circuit including a primary power terminal connected for powering sad peripheral circuits and a memory circuit control terminal which receives backup power when there is a loss of a primary power supply connected to said primary power terminal, comprising:

a voltage comparator connected said primary power terminal and said control terminal for driving a comparator output node to a first state when the voltage at said control terminal does not exceed the voltage at said control terminal by more than a preselected offset voltage and to a second state when the voltage at said control terminal exceeds the voltage at said primary power terminal by more than said preselected offset voltage, means connected to said comparator output node for driving a power status node to a first state when said comparator node is at said second state and for driving said power status node to a second state when said comparator output node is at said first state, means for coupling said primary power terminal to a power node for said memory array through a low impedance path when said power status node is at said second state and through a high impedance path when said power status node is at said first state, means for coupling said control terminal to said memory array power node through a low impedance path when said power status node is at said first state and through a high impedance path when said power status node is at said second state, means for generating a substrate bias voltage which is applied to bias the substrate of said integrated semiconductor memory circuit, means connected to receive said bias voltage for driving a monitor node to a first state when said bias voltage exceeds a preset voltage and driving said monitor node to a second state when said bias voltage does not exceed said preset voltage, means connected between said monitor node and said power status node for driving said power status node to the second state thereof when said monitor node is at the second state thereof, means connected to said power status node for generating an inhibit signal which is transferred to said memory access circuits to inhibit the operation thereof when said power status node is at the first state thereof, and a plurality of transistors each having gate source and drain terminals, the gate terminals thereof connected in common to said power status node, the drain terminals thereof connected in common to said memory array power node, and the source terminal of each transistor connected to a respective bit line of said memory array to bias said bit lines to a predetermined voltage when said memory circuit is powered down.

12. The circuit recited in claim 11 wherein said preselected offset voltage is set to essentially zero volts whereby said output node is driven to a first state when the voltage at said primary power terminal exceeds the voltage at said control terminal and said output node is driven to a second state when the voltage at said control terminal exceeds the voltage at said primary power terminal.

* * * * *